United States Patent [19]

Campbell

[11] Patent Number: 5,928,529
[45] Date of Patent: Jul. 27, 1999

[54] COMPOSITION AND METHOD FOR STRIPPING TIN AND TIN-LEAD FROM COPPER SURFACES

[75] Inventor: Scott Campbell, Fountain Hills, Ariz.

[73] Assignee: Morton International, Inc., Chicago, Ill.

[21] Appl. No.: 09/075,716

[22] Filed: May 11, 1998

Related U.S. Application Data

[63] Continuation of application No. 08/521,305, Aug. 30, 1995.

[51] Int. Cl.$^6$ ..................................................... C23D 1/00
[52] U.S. Cl. ........................ 216/95; 252/79.1; 252/79.2; 252/79.4; 156/656
[58] Field of Search ................................ 252/79.1, 79.2, 252/79.4; 156/656; 216/95

[56] References Cited

U.S. PATENT DOCUMENTS

| | | | |
|---|---|---|---|
| 3,770,530 | 11/1973 | Fujimoto | 252/79.4 |
| 3,948,703 | 4/1976 | Kushibe | 252/79.4 |
| 4,713,144 | 12/1987 | Schiller | 216/95 |
| 5,219,484 | 6/1993 | Krulik | 252/79.2 |
| 5,244,539 | 9/1993 | McGrath et al. | 216/13 |
| 5,505,872 | 4/1996 | Kruilik et al. | 252/79.2 |
| 5,512,201 | 4/1996 | Singh et al. | 252/79.2 |

*Primary Examiner*—Benjamin Utech
*Assistant Examiner*—Lynette T. Umez-Eronini
*Attorney, Agent, or Firm*—Gerald K. White; Charles N. Lovell

[57] ABSTRACT

A composition and method for stripping tin or tin-lead alloys, and any underlying copper-tin intermetallic, from a copper surface. The composition includes an aqueous solution of approximately 5–60% nitric acid by weight, approximately 0.5–30% ferric nitrate by weight, and a nitric acid stabilizer selected from the group consisting of an amino-triazole, an amino-isoxazole, and a linear amino sulfone in the form $H_2N-SO_2-R$, where R is any alkyl or benzene group, wherein the stabilizer is present at a concentration sufficient to inhibit exothermic conditions, emission of toxic NOx gas, and copper attack. A soluble source of halogen ion, such as hydrochloric acid, can be added to the composition to yield a uniform, reflective, bright pink copper appearance, and to further reduce sludge formation. In addition, sludge formation can be eliminated by adding a soluble source of sulfate ion ($SO_4^{-2}$) to the composition.

16 Claims, No Drawings

COMPOSITION AND METHOD FOR STRIPPING TIN AND TIN-LEAD FROM COPPER SURFACES

REFERENCE TO RELATED DOCUMENTS

This is a continuation of a previous application filed in the United States Patent and Trademark Office by Scott Campbell on Aug. 30, 1995, of the same title, and assigned application Ser. No. 08/521,305, pending.

FIELD OF THE INVENTION

The present invention relates to stripping tin and tin-lead alloys from copper surfaces, and more particularly, to an aqueous nitric acid-based composition and method for stripping tin and tin-lead alloys from copper surfaces such as printed circuit boards, which composition and method function in the stripping operation to inhibit exothermic conditions, emission of toxic NOx gas, copper attack, and sludge formation, while yielding a uniform, reflective, bright pink surface on the underlying copper.

BACKGROUND OF THE INVENTION

When printed circuit boards ("PCBs") are fabricated, a film or layer of tin and/or tin-lead alloy is typically plated on the conductive copper surface of the board to serve as an etch resist in the subsequent etching away of other copper surfaces. Later in the fabrication process, the tin and tin-lead must be chemically stripped from the copper circuit. One method of stripping tin and tin-lead from copper surfaces uses a single solution containing nitric acid and ferric nitrate. It is known that as tin or tin/lead contacts copper, tin molecules migrate into the copper, forming a copper-tin inner-metallic layer. A stripping solution containing nitric acid and ferric nitrate will remove both the tin or tin/lead, and the copper-tin inner-metallic layer. The nitric acid strips the pure tin or tin-lead off the panel, and ferric nitrate is used to aid in stripping the remaining copper-tin inner-metallic layer to bare copper.

However, problems arise when using nitric acid/ferric nitrate tin and tin-lead stripping solutions. As described in more detail below, these problems include negative effects on the appearance of the underlying copper, excessive sludge formation, potential for an exothermic condition, excessive attack on the underlying copper, and the evolution of toxic NOx gas from the nitric acid while in the presence of the tin and copper ions. To correct these problems, different materials have been added to the nitric acid/ferric nitrate stripping solution to stabilize the solution. However, the added material often increase the cost of the stripping process. In some cases, the added materials are so expensive the resultant stripping solutions are impractical to use.

As described above, when the tin or tin/lead etch resist is stripped, the copper circuit is exposed on the dielectric material. For aesthetic and functional reasons, it is important that the copper surface resulting from the stripping operation have a uniform, reflective, bright pink appearance. For example, the circuit board can then be inspected using automated optical inspection, or AOI. AOI uses reflected light from the dielectric material and copper circuit to inspect the boards. Because the dielectric material is dull and non reflective, if the copper surface is uniform, reflective, and bright pink, AOI can easily distinguish between the dull, non-reflective dielectric material and the uniform, reflective, bright pink copper. Therefore, a uniform, reflective, bright pink copper surface increases the effectiveness of the AOI. Having a copper surface which is a non-uniform matte pink finish decreases the effectiveness of AO.

Sludge formation is another problem associated with conventional tin and tin/lead nitric acid-based stripping. During the stripping process, tin and tin/lead stripping solutions contain dissolved metals. As the metal loading of the stripping solution increases, the metal precipitates out of solution as sludge. It is believed that the sludge precipitate is stannic oxide. In spray applications, the sludge can cause clogging in the spray nozzles. When the stripping solution is sprayed onto the circuit boards to strip the tin or tin/lead, sludge is also sprayed onto the boards. This sludge may be difficult to rinse off of the circuit board, leaving a white, chalky material on the board. Sludge also makes it difficult to keep conveyerized process equipment clean..

During a nitric acid-based tin and tin/lead stripping process, when a certain metal loading level is reached, the stripping solution often becomes unstable, creating a potential for an exothermic condition, which is an instant release of a massive amount of heat. Typically, large amounts of toxic NOx gas are released during an exothermic condition, and the striping solution foams excessibely. Furthermore, the temperature of the stripping solution can increase to 150° F. or greater. Obviously, the occurrence of exothermic conditions can damage the operating equipment.

Another problem caused by conventional nitric acid-based tin and tin/lead stripping solutions is an excessive copper attack rate. Obviously it is desirable to minimize copper attack rate during tin or tin/lead stripping. A high copper attack results in stripping the copper off the circuit and exhausting the strength of the tin and tin/lead stripping solution on unnecessary copper removal. Also, process consistency is not achieved when a stripping solution has an initial high copper attack rate which drastically decreases with metal loading.

Evolution of toxic NOx gas during the stripping process poses a critical safety problem associated with nitric acid/ferric nitrate-based stripping solutions. Toxic NOx gas evolves from the nitric acid while in the presence of the tin and copper ions. The NOx evolving from the reaction between nitric acid and tin or tin/lead is any mixture of nitrogen dioxide and nitrogen monoxide. Both nitrogen dioxide and nitrogen monoxide are considered poisonous gases by the Occupational Safety and Health Administration. OSHA has set exposure limits on these toxic gases; the present permissible exposure level of nitrogen dioxide is 3 ppm, and the time weighted average of exposure for nitrogen monoxide is 25 ppm.

Various methods and compositions have been developed in attempts to stablize nitric acid-based stripping solutions so as to prevent the above-described problems. For example, U.S. Pat. Nos. 4,957,653 and 5,017,267 to Cordani disclose the addition of an alkane sulfonic acid such as methane sulfonic acid, to form highly water-soluble salts of the dissolved metals. However, the expense of the additional raw material leads to an expensive tin and tin/lead stripping process. A more recent Cordani patent (U.S. Pat. No. 5,234,542) uses sulfuric acid to stabilize the nitric acid stripping solution, thus inhibiting copper attack. However, the other problems, such as high levels of toxic NOx emmissions, remain.

U.S. Pat. No. 4,713,144 to Schiller discloses the use of sulfamic acid to stabilize the nitric acid stripping solution and to inhibit copper attack. However, the Schiller solution causes excessive sludge formation, and has a high potential for creating an exothermic condition. Furthermore, the Schiller method and composition leaves a non-uniform, matte pink finish on the underlying copper surface, rather than the desired uniform, reflective, bright pink appearance.

U.S. Pat. No. 4,374,744 to Kawanabe principally addresses the problem of copper attack. The Kawanabe patent discloses stripping solutions consisting of an inorganic and/or organic acid, an oxidizing agent, and a heterocyclic compound free of sulfur but containing a nitrogen atom in the form of =NH or ≡N as a ring forming member. Examples given include imidazole and derivatives thereof and triazoles and derivatives thereof. The Kawanabe patent lists general categories of compounds expected to be suitable in inhibiting copper attack, such as pyrroles, pyrazoles, imidazoles, and triazoles. However, not all compounds in the Kawanabe category of "heterocyclic compound free of sulfur but containing a nitrogen atom in the form of =NH or ≡N as a ring forming member" function to inhibit copper attack, and different compounds within the same chemical category exhibit different behavior regarding inhibiting copper attack. Not only do many of the Kawanable solutions cause excessive sludge formation, but, more critically, most such solutions release approximately 100 to 1000 ppm of NOx gas during stripping, orders of magnitude higher than the level of NOx deemed acceptable by OSHA, as evidenced by the visual orange NOx fumes observed during the stripping process.

SUMMARY OF THE INVENTION

The present invention is summarized in one embodiment in a composition for stripping tir or tin-lead alloys, and any underlying copper-tin intermetallic, from a copper surface. The composition includes an aqueous solution of approximately 5–60% nitric acid by weight, approximately 0.5–30% ferric nitrate by weight, and a nitric acid stabilizer selected from the group consisting of an amino-triazole, an amino-isoxazole, and a linear amino sulfone in the form $H_2N-SO_2-R$, where R is any alkyl or benzene group, wherein the stabilizer is present at a concentration sufficient to inhibit exothermic conditions, emission of toxic NOx gas, and copper attack.

In another embodiment of the present invention, a soluble source of halogen ion, such as hydrochloric acid, is added to the composition to yield a uniform, reflective, bright pink copper appearance, and to reduce sludge formation. Sludge can also be eliminated by adding a soluble source of sulfate ion ($SO_4^{-2}$), such as sulfuric acid or ferric sulfate, to the composition.

It is an object of the present invention to provide a tin and tin/lead stripping composition and method that inhibits the emission of toxic NOx gas.

It is another object of the present invention to provide a tin and tin/lead stripping composition and method which inhibits the potential for an exothermic condition even under conditions of high metal loading.

It is another object of the present invention to provide a tin and tin/lead stripping composition and method which minimizes copper attack.

It is another object of the present invention to provide a tin and tin/lead stripping composition and method which eliminates the formation of sludge.

It is another object of the present invention to provide a tin and tin/lead stripping composition and method which yields a copper surface that is a uniform, reflective, bright pink.

DETAILED DESCRIPTION OF THE INVENTION

The present specification describes an aqueous, nitric acid-based composition and method for stripping tin and tin-lead alloys from copper surfaces such as printed circuit boards, which composition and method function in the stripping operation to inhibit exothermic conditions, emission of toxic NOx gas, copper attack, and sludge formation, while yielding a uniform, reflective, bright pink surface on the stripped copper.

The aqueous composition includes nitric acid present in an amount sufficient to strip the tin and/or tin-lead alloy layer of etch resist; the concentration of nitric acid typically falls in the range of about 5–60% by weight (preferably approximately 20–40% by weight). The composition also includes ferric nitrate in an amount sufficient to strip the remaining copper-tin inner-metallic layer which is present, which is in the range of about 0.5–30% by weight (preferably approximately 5–15% by weight). The composition also includes a nitric acid stabilizer present in a concentration sufficient to inhibit the critical problems exhibited by prior art stripping compositions and methods. These problems include the creation of exothermic conditions, emission of toxic NOx gas from the nitric acid while in the presence of tin and copper ions, and excessive copper attack. The stabilizer concentration should be at least about 5 g/l, preferably in the range of about 5–30 g/l, and most preferably, about 20 g/l. Suitable nitric acid stabilizers include an amino-triazole (preferrably 4-amino-1,2,4-triazole), an amino-isoxazole (preferrably 3-amino-5-methylisoxazole), and a linear amino sulfone in the form $H_2N-SO_2-R$, where R is any alkyl or benzene group; (preferably sulfanilamide), sulfamide, and ammonium sulfamate.

In developing the present invention, the inventor first addressed the prior art problems of NOx emission and excessive copper attack by initially screening a number of potential stabilizing compounds to determine which showed the potential for inhibiting copper attack and eliminating emission of toxic NOx gas. Most of the compounds tested in the screening study and in the Examples were purchased from Aldrich Chemical Company, Milwaukee, Wis.; sulfamide was purchased from Sigma Chemical Company, St. Louis, Mo.

Copper attack was considered acceptable if the copper etch rate on copper coupons immersed in the composition was less than 20 micro inches of copper per minute. NOx gas emission was considered acceptable if no orange NOx gas was visible during stripping, and unacceptable if the orange gas was visible during stripping. The following procedure was followed for screening all potential stabilizer compounds.

An aqueous stripping composition having the following composition was made: 28 percent by weight nitric acid, 7 percent by weight ferric nitrate, 20 grams per liter of the potential stabilizer. Copper coupons plated with tin to a thickness of 400 micro inches and copper coupons with tin/lead plated to a thickness of 350 micro inches were immersed in the stripping composition at 75° F. The copper etch rate on the coupon was measured, and the presence or absence of NOx gas was determined visually. The initial screening results are presented in Table I. Five compounds (sulfaniliamide, sulfamide, 4-amino-1,2,4-triazole, 3-amino-5-methylisoxazole, and ammonium sulfamate) showed great promise, and were selected for further study.

TABLE I

| Possible Stabilizer | Copper Attack | Evolution of NOx |
|---|---|---|
| sulfaniliamide | acceptable | acceptable |
| sulfamide | acceptable | acceptable |
| methanesulfonamide | unacceptable | unacceptable |
| 2-aminobenzenesulfonamide | unacceptable | unacceptable |
| 4-amino-6-chlor-1,3-benzenedisulfonamide | unacceptable | unacceptable |
| 4-(aminomethyl)benzenesulfonamide | unacceptable | unacceptable |
| N-(2-thiazolyl) sulfanilamide | unacceptable | unacceptable |
| sulfisomidine | unacceptable | unacceptable |
| amino-methane sulfonic acid | unacceptable | unacceptable |
| 4-carboxybenzene sulfonamide | unacceptable | unacceptable |
| 4-amino-1,2,4-triazole | acceptable | acceptable |
| 3,5-diamino-1,2,4-triazole | unacceptable | unacceptable |
| sulfisoxazole; | unacceptable | unacceptable |
| sulfadiazine | unacceptable | unacceptable |
| sulfamethazine; | unacceptable | unacceptable |
| 3-amino-5-methylisoxazole | acceptable | acceptable |
| 5-amino-3-methylisoxazole | unacceptable | unacceptable |
| 4-amino-antipyrine | unacceptable | unacceptable |
| 2,4-diamino-6-hydroxypyrimidine | unacceptable | unacceptable |
| 3-sulfamoyl-L-alanine | unacceptable | unacceptable |
| 1,2,3-triazole | unacceptable | unacceptable |
| benzotriazole | unacceptable | unacceptable |
| ammonium sulfamate | acceptable | acceptable |

The results summarized in Table I illustrate a critical discovery made by the present inventor relating to the prior art compositions disclosed in the Kawanabe patent (U.S. Pat. No. 4,374,744). The Kawanabe stripping solutions included an inorganic and/or organic acid, an oxidizing agent, and a heterocyclic compound free of sulfur but containing a nitrogen atom in the form of =NH or ≡N as a ring forming member. Examples given include imidazole and derivatives thereof and triazoles and derivatives thereof. However, the present inventor discovered that if an amino functional group ($NH_2$) is not bonded to the heterocyclic compound, an unacceptable amount of toxic NOx gas will be emitted during the stripping operation. Therefore, when the amino group is present with the triazole (as is the case with 4-amino-1.2.4-triazole) emission of toxic NOx gas was prevented. In contrast, triazole compounds lacking an amino functional group, such as benzotriazole and 1,2,3-triazole, emit toxic NOx from the stripping solution while in contact with tin, tin-lead, and copper. The presence of an amino functional group on the triazole also results in a drastic reduction in attack on the underlying copper. Therefore, the amino-triazole stabilizer discovered by the present inventor provides unexpectedly superior results over the general class of heterocyclic compounds free of sulfur but containing a nitrogen atom in the form of =NH or ≡-N as a ring forming member, as described in the Kawanabe patent.

The following Examples illustrate further study of the five stabilizing compounds identified in the initial sceening study described above. The Examples note tin and tin/lead strip time, copper attack, evolution of NOx for each stripping solution, and exotherm potential. The tin and tin/lead strip time was determined by immersing a tin or tin/lead coupon in the solution, and noting the time required to completely strip the tin or tin/lead, and the copper-tin inner-metallic. The copper attack was measured by immersing a copper coupon in the solution and determining the amount of copper etched by the solution. The evolution of NOx was determined by noting the emission of orange NOx gas. The solution was considered to have exotherm potential, if while loading the samples with metal, a temperature in excess of 150° F. was observed.

EXAMPLE 1
Sulfanilamide Stabilizer

An aqueous stripping solution consisting of 28 percent by weight nitric acid, 7 percent by weight ferric nitrate, and 20 grams per liter sulfanilamide was made. Copper coupons plated with tin to a thickness of 400 micro inches and copper coupons with tin/lead plated to a thickness of 350 micro inches were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 8 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on copper appearance might occur, the above stripping solution was then loaded to 12 ounces per gallon tin, and 2.5 ounces per gallon copper. The tin was completely stripped off of the coupons in 60 seconds. The tin-lead was completely stripped off of the coupons in 45 seconds. A copper coupon was then immersed for an additional 5 minutes. It was determined that the stripping solution had etched less than 4 micro inches of copper per minute. The appearance of the copper coupons was semi-bright pink. There was no detectable evolution of NOx gas. An exotherm did not occur while loading the solution.

EXAMPLE 2
3-Amino-5-methylisoxazole Stabilizer

An aqueous stripping solution consisting of 28 percent by weight nitric acid, 7 percent by weight ferric nitrate, and 20 grams per liter of 3-amino-5-methlyisoxazole was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 10 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on copper appearance might occur, the above stripping solution was then loaded to 12 ounces per gallon tin, and 2.5 ounces per gallon copper. The tin was completely stripped off of the coupons in 52 seconds. The tin-lead was completely stripped off of the coupons in 47 seconds. A copper coupon was then immersed for an additional 5 minutes. It was determined that the stripping solution had etched less than 3 micro inches of copper per minute. The appearance of the copper coupons was semi-bright pink. There was no detectable evolution of NOx gas. An exotherm did not occur while loading the solution.

EXAMPLE 3
4-Amino-1,2,4-triazole Stabilizer

An aqueous stripping solution consisting of 28 percent by weight nitric acid, 7 percent by weight ferric nitrate, and 20 grams per liter of 4-amino-1,2,4-triazole was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 9 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 100 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas. An exotherm did not occur while loading the solution.

EXAMPLE 4

Sulfamide Stabilizer

An aqueous stripping solution consisting of 28 percent by weight nitric acid, 7 percent by weight ferric nitrate, and 20 grams per liter of sulfamide was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 9 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas. An exotherm did not occur while loading the solution.

EXAMPLE 5

Ammonium sulfamate Stabilizer

An aqueous stripping solution consisting of 28 percent by weight nitric acid, 7 percent by weight ferric nitrate, and 50 grams per liter of ammonium sulfamate. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 18 seconds. A copper coupon was then immersed in this formula for an additional 5 minutes. It was determined that the stripping solution had etched less than 8 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas. An exotherm did not occur while loading the solution.

EXAMPLE 6

Comparison: Sulfamic Acid Stabilizer

This Example replicates conditions disclosed in U.S. Pat. No. 4,713,144 to Schiller. An aqueous stripping solution consisting of 28 percent by weight nitric acid, 7 percent by weight ferric nitrate, and 45 grams per liter of sulfamic acid (in early experiments replicating the Schiller conditions, 20 grams per liter of sulfamic acid were used in the stripping solution. However, the solutions were unstable, and it was necessary to increase the amount of sulfamic acid). Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 18 seconds. A copper coupon was then immersed in this formula for an additional 5 minutes. It was determined that the stripping solution had etched 8 micro inches of copper per minute. The copper appearance of the coupons was non-uniform, matte pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was non-uniform, matte pink. There was no detectable evolution of NOx gas. An exotherm occurred while loading the solution. The final temperature after the exotherm was 155° F.

EXAMPLE 7

Comparison: Benzotriazole Stabilizer

This Example replicates conditions disclosed in U.S. Pat. No. 4,374,744 to Kawanabe et al. An aqueous stripping solution consisting of 28 percent by weight nitric acid, 7 percent by weight ferric nitrate, and 20 grams per liter of benzotriazole. Tin plated copper coupons and tin-lead plated copper coupons, as described in Example 1, were immersed in the stripping solution at 75° F. The tin was completely stripped off of the coupons in 18 seconds. The tin-lead was completely stripped off of the coupons in 20 seconds. A copper coupon was then immersed in this formula for an additional 5 minutes. It was determined that the stripping solution had etched 150 micro inches of copper per minute. The appearance of the copper coupons was semi-bright pink. This demonstrates that a not all heterocyclic compounds free of sulfur but containing a nitrogen atom in the form of =NH or ≡N as a ring forming member inhibit copper attack. Toxic NOx gas evolved during the stripping process.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched 20 micro inches of copper per minute The appearance of the copper coupons was semi-bright pink. Toxic NOx gas evolved during the stripping process. An exotherm did not occur while loading the solution.

Examples 6 and 7 are provided to illustrate the improvements over prior art. Example 6 replicates conditions disclosed in U.S. Pat. No. 4,713,144 to Schiller, and an exothermic condition occurred. As can be seen by comparing Examples 1–5 to Example 6 (in which Example more than twice as much stabilizer was used), the stabilizers of the present invention inhibit creation of an exothermic condition.

Example 7 replicates conditions disclosed in U.S. Pat. No. 4,374,744 to Kawanabe et al. Comparing Example 3 to Example 7, it is evident that great improvements in inhibiting copper attack and toxic NOx gas evolution were achieved by using a compound which has an amino functional group bonded to the heterocyclic compound (i.e., the 4-amino-1,2,4-triazole stabilizer used in Example 3, compared to the benzotriazole stabilizer used in Example 7). The amino-triazole provides unexpectedly superior results over benzotriazole. As shown, the initial copper attack for the Kawanabe stripping solution replicated in Example 7, is 150 micro inches per minute. Such excessive copper attack results in an undesirable amount of copper removal during the tin or tin/lead stripping process. When the bath is loaded with stripped tin or tin/lead, the copper attack is decreased to 20 micro inches per minute. Therefore, the Kawanabe stripping solution has a copper attack that decreases tenfold over the life of the stripping process. Process consistency cannot be achieved with a stripping solution that initially has a high copper attack, which significantly decreases with metal loading. More critically, toxic NOx gas was evolved during the stripping process from the Kawanabe stripping solution used in Example 7; NOx was not emitted during the course of Example 3, which used a composition of the present invention including the stabilizer 4-amino-1,2,4-triazole.

The data for Examples 1 through 7 has been summarized in TABLE II, for stripping composition with no metal loading. The Tin Strip Time is considered acceptable, if the tin and copper-tin inner-metallic can be completely stripped in under 2 minutes.

TABLE II

| Example | Formula | Tin Strip Time | Copper Attack | Exotherm | NOx evolution |
|---|---|---|---|---|---|
| 1 | 28% nitric acid 7% ferric nitrate 20 g/L Sulfanilamide | acceptable | 8 micro inches per minute | no | no |
| 2 | 28% nitric acid 7% ferric nitrate 20 g/L 3-amino-5-methylisoxazole | acceptable | 10 micro inches per minute | no | no |
| 3 | 28% nitric acid 7% ferric nitrate 20 g/L 4-amino-1,2,4-triazole | acceptable | 9 micro inches per minute | no | no |
| 4 | 28% nitric acid 7% ferric nitrate 20 g/L sulfamide | acceptable | 9 micro inches per minute | no | no |
| 5 | 28% nitric acid 7% ferric nitrate 50 g/L ammonium sulfamate | acceptable | 8 micro inches per minute | no | no |
| 6 | 28% nitric acid 7% ferric nitrate 50 g/L sulfamic acid | acceptable | 8 micro inches per minute | yes | no |
| 7 | 28% nitric acid 7% ferric nitrate 20 g/L benzotriazole | acceptable | 150 micro inches per minute | no | yes |

It is also an objective of this invention to create a tin and tin/lead stripping solution which improves the appearance of the underlying copper. As described above, it is desired to have uniform, reflective, bright pink copper surface. Therefore, the composition may also include as a brightening agent a water soluble source of halogen ion such as hydrochloric acid or the equivalent, at a concentration in the range of about 0.1%–20% by weight (preferably, 0.1%–2% by weight), to provide a uniform, reflective, bright pink appearance on the stripped copper surface.

The following Examples further illustrate the invention. The Examples note tin and tin/lead strip time, copper attack, and copper appearance. The tin and tin/lead strip time was determined by immersing a tin or tin/lead coupon in the stripping solution and noting the time required to completely strip the tin or tin/lead, and the copper-tin inner-metallic. The copper attack was measured by immersing a copper coupon in the solution and determining the amount of copper etched by the solution. The copper appearance of the tin or tin/lead stripped coupons was determined by visual inspection of the stripped coupon. The copper appearance of the tin or tin/lead stripped coupons fall into several categories, non-uniform matte pink, semi-bright pink, and uniform reflective bright pink.

EXAMPLE 8a

Sulfanilamide Stabilizer

An aqueous stripping solution consisting of 28 percent by weight nitric acid, 7 percent by weight ferric nitrate, and 20 grams per liter sulfanilamide was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 8 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 60 seconds. The tin-lead was completely stripped off of the coupons in 45 seconds. A copper coupon was then immersed for an additional 5 minutes. It was determined that the stripping solution had etched less than 4 micro inches of copper per minute. The appearance of the copper coupons was semi-bright pink. There was no detectable evolution of NOx gas.

EXAMPLE 8b

The above stripping solution was improved by adding 0.2 percent by weight hydrochloric acid, as a source of halogen ion, to improve the copper appearance. There was no effect on the strippability of the stripping solution, but the appearance of the copper coupons was uniform, reflective, bright pink. There was no detectable evolution of NOx gas.

EXAMPLE 9a
3-Amino-5-methylisoxazole Stabilizer

An aqueous stripping solution consisting of 28 percent by weight nitric acid, 7 percent by weight ferric nitrate, and 20 grams per liter of 3-amino-5-methlyisoxazole was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 10 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 52 seconds. The tin-lead was completely stripped off of the coupons in 47 seconds. A copper coupon was then immersed for an additional 5 minutes. It was determined that the stripping solution had etched less than 3 micro inches of copper per minute. The appearance of the copper coupons was semi-bright pink. There was no detectable evolution of NOx gas.

EXAMPLE 9b

The above stripping solution was improved by adding 0.2 percent by weight hydrochloric acid, as a source of halogen ion, to improve the copper appearance. There was no effect on the strippability of the stripping solution, but the copper appearance was uniform, reflective, bright pink. There was no detectable evolution of NOx gas.

EXAMPLE 10a
4-Amino-1,2,4-triazole Stabilizer

An aqueous stripping solution consisting of 28 percent by weight nitric acid, 7 percent by weight ferric nitrate, and 20 grams per liter of 4-amino-1,2,4-triazole was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 9 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 100 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas.

EXAMPLE 10b

The above stripping solution was improved by adding 0.2 percent by weight hydrochloric acid, as a source of halogen ion, to improve the copper appearance. There was no effect on the strippability of the stripping solution, but the copper appearance was uniform, reflective, bright pink. There was no detectable evolution of NOx gas.

EXAMPLE 11a
Sulfamide Stabilizer

An aqueous stripping solution consisting of 28 percent by weight nitric acid, 7 percent by weight ferric nitrate, and 20 grams per liter of sulfamide was made. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 15 seconds. A copper coupon was then immersed in this formula for an additional 5 minutes. It was determined that the stripping solution had etched less than 9 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas.

EXAMPLE 11b

The above stripping solution was improved by adding 0.2 percent by weight hydrochloric acid, as a source of halogen ion, to improve the copper appearance. There was no effect on the strippability of the stripping solution, but the copper appearance was uniform, reflective, bright pink. There was no detectable evolution of NOx gas.

EXAMPLE 12a
Ammonium sulfamate Stabilizer

An aqueous stripping solution consisting of 28 percent by weight nitric acid, 7 percent by weight ferric nitrate, and 50 grams per liter of ammonium sulfamate. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 18 seconds. A copper coupon was then immersed in this formula for an additional 5 minutes. It was determined that the stripping solution had etched less than 8 micro inches of copper per minute. The appearance of the copper coupons was semi-bright pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was semi-bright pink. There was no detectable evolution of NOx gas.

EXAMPLE 12b

The above stripping solution was improved by adding 0.2 percent by weight hydrochloric acid, as a source of halogen ion, to improve the copper appearance. There was no effect on the strippability of the stripping solution, but the copper appearance was uniform, reflective, bright pink. There was no detectable evolution of NOx gas.

EXAMPLE 13a
Comparison: Sulfamic Acid Stabilizer

This Example replicated conditions disclosed in U.S. Pat. No. 4,713,144 to Schiller. An aqueous stripping solution consisting of 28 percent by weight nitric acid, 7 percent by weight ferric nitrate, and 45 grams per liter of sulfamic acid. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 18 seconds. A copper coupon was then immersed in this formula for an additional 5 minutes. It was determined that the stripping solution had etched 8 micro inches of copper per minute. The copper appearance of the coupons was non-uniform, matte pink. There was no detectable evolution of NOx gas.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched less than 2 micro inches of copper per minute. The appearance of the copper coupons was non-uniform, matte pink. There was no detectable evolution of NOx gas.

EXAMPLE 13b

To demonstrate the improved copper appearance the present invention can provide over the copper appearance resulting from the stripping operation disclosed in the Schiller patent, the stripping solution of Example 13a was improved by adding 0.2 percent by weight hydrochloric acid, as a source of halogen ion, to improve the copper appearance. There was no effect on the strippability of the stripping solution, but the copper appearance was uniform, reflective, bright pink. There was no detectable evolution of NOx gas.

EXAMPLE 14a
Comparison: Benzotriazole Stabilizer

This Example replicated conditions disclosed in to U.S. Pat. No. 4,374,744 to Kawanabe et al. An aqueous stripping solution consisting of 28 percent by weight nitric acid, 7 percent by weight ferric nitrate, and 20 grams per liter of benzotriazole. Tin plated copper coupons and tin-lead plated copper coupons, as described in example 1, were immersed in the stripping solution at 75° F. The tin was completely stripped off of the coupons in 18 seconds. The tin-lead was completely stripped off of the coupons in 20 seconds. A copper coupon was then immersed in this formula for an additional 5 minutes. It was determined that the stripping solution had etched 150 micro inches of copper per minute. The appearance of the copper coupons was semi-bright pink. This demonstrates that a not all heterocyclic compounds free of sulfur but containing a nitrogen atom in the form of =NH or ≡N as a ring forming member inhibit copper attack. Toxic NOx gas evolved during the stripping process.

To test the effectiveness of the stabilizer under high metal loading conditions, when the problems of an exothermic condition and adverse effects on the copper appearance might occur, the above stripping solution was then loaded to 12 ounces per gallon tin, and 2.5 ounces per gallon copper. The tin was completely stripped off of the coupons in 90 seconds. The tin-lead was completely stripped off of the coupons in 75 seconds. A copper coupon was then immersed for an additional 5 minutes. It was determined that the stripping solution had etched 20 micro inches of copper per minute The appearance of the copper coupons was semi-bright pink. Toxic NOx gas evolved during the stripping process.

EXAMPLE 14b

The stripping solution of Example 14a was improved by adding 0.2 percent by weight hydrochloric acid, as a source of halogen ion, to improve the copper appearance. There was no effect on the strippability of the solution. The copper etch rate was determined to be 150 micro inches of copper per minute. The copper appearance was uniform, reflective, bright pink. Toxic NOx gas evolved during the stripping process.

Examples (13a) and (14a) are provided to illustrate the improvements over prior art. Example (13a) replicated conditions disclosed in U.S. Pat. No. 4,713,144 to Schiller. An improvement in copper appearance was achieved by adding halogen ion to the Schiller composition. The improved uniform, reflective, bright pink copper surface increases the effectiveness of automated optical inspection over what can be achieved with the non-uniform, reflective, matte pink copper appearance which typically results from stripping with an unmodified Schiller composition. Example (14a) replicated conditions disclosed in U.S. Pat. No. 4,374,744 to Kawanabe et al. As was the case with modifications to the Schiller composition, improvements in copper appearance are also achieved by the addition of the halogen ion to the original Kawanabe composition.

The data for examples (8a) through (14b) has been summarized in Table III, for the stripping compositions with no metal loading. The Tin Strip Time is considered acceptable, if the tin and copper-tin inner-metallic can be completely stripped in under 2 minutes. The copper appearance demonstrates the benefits of adding a halogen ion to a stripping solution.

TABLE III

| Example | Formula | Tin Strip Time | Copper Attack | Copper Appearance | NOx evolution |
|---|---|---|---|---|---|
| 8a | 28% nitric acid 7% ferric nitrate 20 g/L Sulfanilamide | acceptable | 8 micro inches per minute | semi-bright pink | no |
| 8b | 28% nitric acid 7% ferric nitrate 20 g/L Sulfanilamide 0.2% hydrochloric acid | acceptable | 8 micro inches per minute | uniform, reflective, bright pink | no |
| 9a | 28% nitric acid 7% ferric nitrate 20 g/L 3-amino-5-methylisoxazole | acceptable | 10 micro inches per minute | semi-bright pink | no |
| 9b | 28% nitric acid 7% ferric nitrate 20 g/L 3-amino-5-methylisoxazole 0.2% hydrochloric acid | acceptable | 10 micro inches per minute | uniform, reflective, bright pink | no |
| 10a | 28% nitric acid 7% ferric nitrate 20 g/L 4-amino-1,2,4-triazole | acceptable | 9 micro inches per minute | semi-bright pink | no |
| 10b | 28% nitric acid 7% ferric nitrate 20 g/L 4-amino-1,2,4-triazole 0.2% hydrochloric acid | acceptable | 9 micro inches per minute | uniform, reflective, bright pink | no |
| 11a | 28% nitric acid 7% ferric nitrate 20 g/L sulfamide | acceptable | 9 micro inches per minute | semi-bright pink | no |
| 11b | 28% nitric acid 7% ferric nitrate 20 g/L sulfamide 0.2% hydrochloric acid | acceptable | 9 micro inches per minute | uniform, reflective, bright pink | no |
| 12a | 28% nitric acid 7% ferric nitrate 50 g/L ammonium sulfamate | acceptable | 8 micro inches per minute | semi-bright pink | no |
| 12b | 28% nitric acid 7% ferric nitrate 50 g/L ammonium sulfamate 0.2% hydrochloric acid | acceptable | 8 micro inches per minute | uniform, reflective, bright pink | no |
| 13a | 28% nitric acid 7% ferric nitrate 50 g/L sulfamic acid | acceptable | 8 micro inches per minute | non-uniform, matte pink | no |
| 13b | 28% nitric acid 7% ferric nitrate 50 g/L sulfamic acid 0.2% hydrochloric acid | acceptable | 8 micro inches per minute | uniform, reflective, bright pink | no |
| 14a | 28% nitric acid 7% ferric nitrate 20 g/L benzotriazole | acceptable | 150 micro inches per minute | semi-bright pink | yes |
| 14b | 28% nitric acid 7% ferric nitrate 20 g/L benzotriazole 0.2% hydrochloric acid | acceptable | 150 micro inches per minute | uniform, reflective, bright pink | yes |

It is also an objective of this invention to create a tin and tin/lead stripping composition which reduces or eliminates the formation of sludge in the tin and tin/lead stripping process, by adding a sludge-preventing agent. Sludge formation creates several problems. In spray applications, the sludge can cause clogging in the spray nozzles. When stripping solution is sprayed onto the circuit boards to strip the tin or tin/lead, sludge is also sprayed onto the boards. This sludge may be difficult to rinse off of the circuit board, leaving a white, chalky material on the board. Sludge also creates problems when cleaning equipment.

It is believed that the sludge which forms during tin and tin/lead stripping is stannic oxide. Stannic oxide is formed from the oxidized tin being stripped from the panels and the oxygen present in the air. Stannic oxide is insoluble in water and acid. If a halogen ion is present, such as a chloride ion, the oxidized tin being stripped from the panels forms stannic chloride, instead of stannic oxide. Unlike stannic oxide, stannic chloride is soluble in water and nitric acid. The formation of stannic chloride prevents the formation of stannic oxide sludge. Thus, when halogen ions are added to brighten and improve the copper appearance, sludge formation is reduced. In order to completely eliminate sludge, the concentration of halogen ion should be increased.

As with the brightening agent, the source of sludge-eliminating halogen ion can be any water soluble compound containing a chloride ion, such as hydrochloric acid or the equivalent, at a concentration in the range of about 0.1%–20% by weight (preferably, 1.5%–5 by weight). The concentration of halogen ion necessary to achieve a uniform, reflective, bright pink copper surface is less than the amount of halogen ion required to eliminate the formation of sludge.

However, the increased amount of halogen ion needed to eliminate sludge formation may have a negative effect on copper appearance when the bath has low metal loading (defined as a level of less than about 7 ounces tin/gal). To ensure a uniform, reflective, bright copper surface, it is necessary to maintain a metal loading level greater than about 10 ounces tin/gal.

Sludge formation can also be eliminated by adding to the composition a water soluble source of sulfate ions, such as sulfuric acid or ferric sulfate, preferably at a concentration in the range of about 0.1%–20% by weight. Sulfate ion does not have a negative effect on the copper appearance. However, adding a sulfate ion to the stripping solution may inhibit tin/lead alloy stripping. Therefore, it is preferred to use sulfate ion to eliminate sludge formation when a pure tin stripping process is to be performed, as opposed to stripping of tin/lead alloys.

If sulfate ions are present, the oxidized tin being stripped from the panels forms stannous sulfate instead of stannic oxide. Unlike stannic oxide, stannous sulfate is soluble in water and acid. The formation of stannous sulfate prevents the formation of stannic oxide sludge. The sulfate ion can be present in the stripping solution as part of any compound, but it is preferred to add the sulfate ion to the stripping solution as sulfuric acid and/or ferric sulfate.

When using halogen ions to eliminate sludge, it should be understood that at low metal loading levels, adding halogen ions to prevent sludge formation may adversely affect the appearance of the copper surface. For instance, a tin and tin/lead stripping bath which strips approximately 20 ounces per gallon of metal, would require such a large amount of halogen ion to eliminate sludge formation, a dark copper appearance would result.

In order to overcome this problem of poor copper appearance at low metal loading levels as a result of addition of halogen ions to prevent sludge formation, it is possible to replenish tin and tin/lead stripping solutions or baths (some of which may already include halogen ions to improve the copper appearance, as described above). Replenishment can be achieved by using a replenisher solution containing a higher halogen ion concentration than the bath to be replenished, but the same concentration of all other components of the original stripping composition. The purpose of replenishing is to maintain metal loading and all active components, except for the halogen ion, at a constant level, while replenishing the halogen ion at an increased level to inhibit the sludge formation. Replenishment can be performed by physically adding replenisher solution and decanting the excess solution that results, or by using an automatic controller which automatically replenishes solution. Automatic replenishment controllers are presently available. One such automatic controller is the TEKtroller™ SG-795, commercially available through SURFACE TEK SPECIALTY PRODUCTS.

The following Examples illustrate reduction and elimination of sludge in tin and tin/lead stipping compositions. In the Examples, stripping compositions were loaded with 20 ounces per gallon tin, and three ounces per gallon copper. The relative amount of sludge was recorded for each solution.

EXAMPLE 15

This Example demonstrates a method for creating a sludge free stripping solution, using the stripping composition disclosed in U.S. Pat. No. 4,713,144 to Schiller. An aqueous stripping solution consisting of 28 percent by weight nitric acid, 7 percent by weight ferric nitrate, and 45 grams per liter of sulfamic acid was made. While loading this stripping sample with tin and copper, the solution had sludge formation. At 20 ounces per gallon tin and 3 ounces per gallon copper, greater than 40 percent of the solution volume was sludge.

One percent (by weight) of hydrochloric acid was then added to the stripping solution described above. This modified stripping solution was loaded to 20 ounces per gallon tin and 3 ounces per gallon copper. While loading the stripping solution with tin and copper, no sludge formed. At 20 ounces per gallon tin and 3 ounces per gallon copper, there was still no sludge present. Therefore, the addition of a sufficient amount of halogen ion prevents the formation of sludge.

Another way to prevent the formation of copper oxide is to add sulfate ions to the stripping solution. However, when sulfate ions are present, it is difficult to strip lead from the holes of the circuit board. Therefore, it is preferred that the use of sulfate ions to prevent sludge formation, be reserved to situations when stripping pure tin.

EXAMPLE 16

This Example demonstrates a method for creating a sludge free stripper, using the stripping composition disclosed in U.S. Pat. No. 4,713,144 to Schiller. An aqueous stripping solution consisting of 28 percent by weight nitric acid, 7 percent by weight ferric nitrate, and 45 grams per liter of sulfamic acid was made. While loading this stripping sample with tin and copper, sludge formed. At 20 ounces per gallon tin and 3 ounces per gallon copper, greater than 40 percent of the solution volume was sludge.

One percent (by weight) sulfuric acid was then added to the stripping composition described above. The resulting modified stripping composition was loaded to 20 ounces per gallon tin and 3 ounces per gallon copper. While loading the stripping solution with tin and copper, no sludge formed. At 20 ounces per gallon tin and 3 ounces per gallon copper, there was still no sludge present. Therefore, the addition of a sufficient amount of sulfate ion prevents the formation of sludge.

EXAMPLE 17

This example also demonstrates a method for creating a sludge free stripping composition, using a stripping composition as disclosed in U.S. Pat. No. 4,713,144 to Schiller. An aqueous stripping solution consisting of 28 percent by weight nitric acid, 7 percent by weight ferric nitrate, and 45 grams per liter of sulfamic acid was made. While loading this stripping sample with tin and copper, sludge formed. At 20 ounces per gallon tin and 3 ounces per gallon copper, greater than 40 percent of the solution volume was sludge.

To the above stripping solution was added 3 percent of ferric sulfate. The resulting composition was loaded to 20 ounces per gallon tin and 3 ounces per gallon copper. While loading the stripping solution with tin and copper, no sludge formed. At 20 ounces per gallon tin and 3 ounces per gallon copper, there was still no sludge present. Therefore, the addition of a sufficient amount of sulfate ion prevent the formation of sludge.

It is to be understood that the present invention is not confined to the particular construction and arrangement herein illustrated and described, but embraces such modified forms thereof as come within the scope of the following claims.

I claim:

1. A method for stripping tin, tin-lead alloys, and any underlying copper-tin intermetallic, from a copper surface without causing exothermic conditions, emission of toxic NOx gas, and copper attack, the method comprising the steps of:
   a. contacting the copper surface with a composition comprising an aqueous solution:
      i. about 5–60% nitric acid by weight;
      ii. about 0.5–30% ferric nitrate by weight; and
      iii. a nitric acid stabilizer selected from the group consisting of amino-triazole, amino-isoxazole, a linear amino sulfone in the form $H_2N-SO_2-R$, where R is any alkyl or benzene, and a sulfamide, wherein the stabilizer is present at a concentration sufficient to inhibit exothermic conditions, emission of toxic NOx gas, and copper attack;
   for a time sufficient to strip the tin, tin-lead alloy, and any underlying copper-tin intermetallic.

2. The method according to claim 1, wherein the concentration of nitric acid stabilizer is in the range of approximately 5 g/l to 30 g/l.

3. The method according to claim 2, further comprising the step of adding to the composition a halogen present in a concentration sufficient to yield a uniform, reflective, bright pink copper surface.

4. The method of claim 3, wherein the halogen is chloride ion present as hydrochloric acid at a concentration in the range of about 0.1% to 20% by weight.

5. The method of claim 2, further comprising the step of adding to the composition a sludge-preventing agent selected from the group consisting of halogen and sulfate ions.

6. The method of claim 5, wherein the halogen ion is chloride ion present as hydrochloric acid at a concentration in the range of about 0.1% to 20% by weight.

7. The method of claim 5, wherein the sulfate ion is present as sulfuric acid at a concentration in the range of about 0.1% to 20% by weight.

8. The method of claim 5, wherein the sulfate ion is present as ferric sulfate at a concentration in the range of about 0.1% to 20% by weight.

9. A method for achieving a uniform, reflective, bright pink copper appearance as a result of stripping, in a nitric acid-based stripping composition, of tin or tin-lead alloys, and any underlying copper-tin intermetallic, from a copper surface, the method comprising the step of adding to the stripping composition a halogen present in a concentration sufficient to yield a uniform, reflective, bright pink copper appearance.

10. The method of claim 9, wherein the halogen is chloride ion present as hydrochloric acid at a concentration in the range of about 0.1% to 20% by weight.

11. A method for eliminating sludge formation during stripping, in a nitric acid-based stripping composition, of tin or tin-lead alloys, and any underlying copper-tin intermetallic, from a copper surface, the method comprising the step of adding to the stripping composition a sludge-preventing agent selected from the group consisting of halogen and sulfate ions.

12. The method of claim 11, wherein the halogen ion is chloride ion present as hydrochloric acid at a concentration in the range of about 0.1% to 20% by weight.

13. The method of claim 11, wherein the sulfite ion is present as sulfuric acid at a concentration in the range of about 0.1% to 20% by weight.

14. The method of claim 11, wherein the sulfate ion is present as ferric sulfate at a concentration in the range of about 0.1% to 20% by weight.

15. A method for stripping tin, tin-lead alloys, and any underlying copper-tin intermetallic, from a copper surface without causing exothermic conditions, emission of toxic NOx gas, and copper attack, the method comprising the steps of:
   a. contacting the copper surface with a composition comprising an aqueous solution of:
      i. about 20–40% nitric acid by weight;
      ii. about 5–15% ferric nitrate by weight; and
      iii. a nitric acid stabilizer selected from the group consisting of a 4-amino-1,2,4-triazole, a 3-amino-5-methylisoxazole, a sulfanilamide, and a sulfamide, such that the stabilizer inhibits exothermic conditions, emissions of toxic NOx gas, and copper attack, wherein the stabilizer is present in an amount of about 5 g/l to 30 g/l.

16. A method for stripping tin, tin-lead alloys, and any underlying copper-tin intermetallic, from a copper surface without causing exothermic conditions, emission of toxic NOx gas, and copper attack, the method comprising the steps of:
   a. contacting the copper surface with a composition comprising an aqueous solution of:
      i. about 5–60% nitric acid by weight;
      ii. about 0.5–30% ferric nitrate by weight; and
      iii. a nitric acid stabilizer selected from the group consisting of a 4-amino-1,2,4-triazole, a 3-amino-5-methylisoxazole, a sulfanilamide, and a sulfamide, wherein the stabilizer is present at a concentration in the range of about 5 g/l up to an amount sufficient to inhibit exothermic conditions, emission of toxic NOx gas, and copper attack;
   for a time sufficient to strip the tin, tin-lead alloy, and any underlying copper-tin intermetallic.

* * * * *